United States Patent [19]

Tributsch et al.

[11] Patent Number: 4,649,227

[45] Date of Patent: Mar. 10, 1987

[54] PHOTOACTIVE PYRITE LAYER AND PROCESS FOR MAKING AND USING SAME

[76] Inventors: Helmut Tributsch, Alsenstr. 24, D-1000 Berlin 39; Ahmed Ennaoui, Kantstr. 26, D 1000 Berlin 12; Wolfram Jaegermann, Ruhlaer Str. 9, D 1000 Berlin 33; Sebastian Fiechter, Gartenstr. 4 a, D 1000 Berlin 37, all of Fed. Rep. of Germany

[21] Appl. No.: 758,508

[22] Filed: Jul. 24, 1985

[30] Foreign Application Priority Data

Jul. 27, 1984 [DE] Fed. Rep. of Germany ....... 3428268

[51] Int. Cl.$^4$ ..................... H01L 31/04; H01M 6/36
[52] U.S. Cl. .............................. 136/252; 252/62.3 R; 252/62.3 V; 252/501.1; 252/519; 423/561 R; 423/565; 204/129.75; 204/130; 204/140; 204/280; 204/290 R; 204/56.1; 429/111; 136/255
[58] Field of Search ............... 136/252, 255; 429/111; 204/290 R, 129.75, 56 R, 130, 140; 252/62.3 R, 62.3 V, 519, 501.1; 423/561 R, 565; 427/74, 87

[56] References Cited

U.S. PATENT DOCUMENTS

| | | | |
|---|---|---|---|
| 4,137,096 | 1/1979 | Maier | 136/252 |
| 4,242,374 | 12/1980 | Sansregret | 427/76 |
| 4,386,142 | 5/1983 | Hodes et al. | 429/111 |

OTHER PUBLICATIONS

R. C. Job et al, Final Report COO-4546-6, "An Improved Fe$_2$O$_3$ Photoelectrochemical Cell", Oct. 1978, DOE Contract EG-77-S-02-4546.
W. Jaegermann et al, J. Appl. Electrochem. vol. 13, pp. 743-750 (1983).
Chem. Abstr., vol. 91, 201139e (1979).
H. M. Kühne et al, J. Electrochem. Soc., vol. 130, pp. 1448-1449 (1983).

Primary Examiner—Aaron Weisstuch
Attorney, Agent, or Firm—McGlew and Tuttle

[57] ABSTRACT

Photoactive pyrite layers, whose preparation and use represent a commercially highly interesting alternative to materials hitherto in common use. The semiconductor material chiefly used until now, e.g. for solar cells, is silicon. However, its costs of manufacture are too high to allow solar cells to be made at favorable cost. The significance of the disclosure and development of pyrite as a semiconductor material, especially for solar cells, lies in the fact that it is plentifully occurring and cheap, as well as environmentally compatible. Pyrite (iron pyrites, FeS$_2$) can be used as a photoactive material in solar cells and in optoelectronic components. It is possible to use both naturally occurring pyrite, after a material treatment to improve the photosensitivity, as well as synthetically produced, single-crystal and polycrystalline pyrite.

16 Claims, 20 Drawing Figures

PHOTOACTIVE PYRITE LAYER AND PROCESS FOR MAKING AND USING SAME

FIELD AND BACKGROUND OF THE INVENTION

The invention relates to photoactive pyrite layers, processes for their preparation, and the use of such pyrite layers.

The semiconductors heretofore principally used for solar cells are silicon, cadmium sulfide, gallium arsenide, copper-indium selenide, and indium phosphide. Semiconductors made from silicon were developed over three decades ago. However, it is known that the costs of making solar cells are still too high for wide commercialization. For single-crystal and polycrystalline silicon, the high requirements in terms of purity of the material and the energy consumption for their preparation are the most important cost factors. For amorphous silicon, adequate stability of the material is not yet assured, so that its use for solar cells has thus far been justified only in special cases.

The other solar cell materials which have been developed intensively are, as a rule, even more expensive than silicon (e.g. GaAs, InP), or they contain less common and toxic elements (e.g. cadmium in cadmium sulfide).

At present it cannot yet be forseen which semiconductor material will prove industrially successful. The development of silicon is generally assigned a high degree of importance. Also, most research work is concerned with this material for solar cells and optoelectronic components. However, for a broad, economical use of silicon as a solar cell material, the costs of preparation must be capable of reduction at least to 10% of present costs.

The fundamental possibility of using pyrite as a solar cell material is known from the *Journal of Applied Electrochemistry*, 13, 743-750 (1983). However, the detailed knowledge required cannot be gleaned from this source.

SUMMARY OF THE INVENTION

The objective of the present invention is to make pyrite material suitable for technological applications, in particular for conversion of solar energy to electrical or chemical energy under favorable cost conditions.

Accordingly, the inventive photoactive pyrite layer is characterized by deviating from stoichiometry of pyrite material by the formula $FeS_{2\pm x}$, wherein $x \leq 0.05$, with an impurity concentration of less than $10^{20}$ per $cm^3$, and a doping of about $10^{16}$ to $10^{19}$ per $cm^3$ of one of the materials selected from the group consisting of manganese (Mn), arsenic (As), cobalt (Co), and chlorine (Cl).

According to another object of the invention, the photoactive pyrite layer has a conversion yield of at least 1%, a quantum yield of up to 90%, a photovoltage of more than 0.25 volts, an effective charge carrier density of more than $10^{15}$ per $cm^3$, and a derived charge carrier mobility of about 200 $cm^2/Vs$.

Depending on the desired type of conductivity, i.e. intrinsic conductivity, p- or n-conductivity, doping should be carried out with one of the elements of Group VA (e.g. As) or Group VIIB (e.g. Mn) for the p type; or with one of the elements of Group VIIA (e.g. Cl) or Group VIII (e.g. Co) for the n type. Since the pyrite exhibits n-conductivity character by means of, for example, vacant sulfur sites, the corresponding inherent conductivity character can be achieved in this way, i.e. a compensation can be effected.

The following should be stated with regard to the pyrite material and its characteristics. The necessary starting materials exist in nature in large amounts. Owing to the extremely high absorption coefficients, i.e. a very small depth of penetration of light, even ultrathin layers of pyrite are sufficient, and one can be satisfied with a relatively low conversion yield.

Further, the high quantum yield which can easily be achieved is surprising. If the photovoltage is allowed to rise to the theoretically achievable maximum of 0.5 V (half band gap), the conversion yield increases sharply, e.g. over 10%. Finally, the extremely small depth of penetration of exactly 160 Å (=0.016 µm) means that the purity requirement for the pyrite material need not be as high as in the case of silicon, for example. Moreover, the flexibility of the ultrathin layers and their low weight are of considerable advantage for manipulation and transport.

Experiments with pyrite ($FeS_2$=iron pyrite) have shown that even the pyrite which occurs in nature is suitable for solar cells and optoelectronic components. This material is also sometimes referred to as iron pyrite, pyrite or, in popular usage, "fool's gold". The raw material supply is no problem, and the established technological experience of the iron industry can also be relied upon. Moreover, the compound itself, as well as the starting elements, are environmentally compatible.

Up to now over 100 different compounds with the pyrite structure have been investigated, all of which exhibit similar lattice constants and therefore permit the preparation of heterojunctions, Schottky barriers and multijunctions with pyrite ($FeS_2$). Among these are compounds such as $MX_2$, $MXX'$, $MXY$, $M_xM_yX_2$, $MY_2$, and $MYY'$;

where

M and M'=Mn, Ni, Zn, Cd, Co, Cu, Ru, Os, Rh, etc.;
X and X'=S, Se, Te; and
Y and Y'=P, As, Sb, Bi.

The compounds are either semiconducting with a large variation in energy gaps, ionization energies, and workfunctions, or they are metallic with widely varying workfunctions.

In comparison with silicon, which is the semiconductor material mostly used up to now, the energy requirement for the production of pyrite is appreciably lower. Thus $FeS_2$ can be made from $Fe_2O_3$ and/or $Fe_3O_4$ and sulfur. The technological know-how of the iron industry is usable here. Furthermore, natural pyrite can be used with thermal treatment, for purification and improvement, at relatively low temperatures (e.g. ion purification, annealing). Finally, pyrite is formed under natural conditions by geological-biological mechanisms which are not yet sufficiently understood. A synthesis oriented in such a direction would be extremely advantageous from the energy viewpoint.

Pyrite and other transition metal chalcogenides of similar electronic structure (valence and conductance band with high contribution of metal d-states) show slight sensitivity with respect to corrosion and photocorrosion. This results from the excitation of electron-hole pairs in quasi-non-binding electronic states. This makes possible a highly promising application in photoelectrochemical solar cells and optoelectronic components.

It is also essential for the invention to indicate preferred possibilities for the preparation of photoactive pyrite layers. As already mentioned above, the starting material for these can be natural pyrite as well as compounds which contain iron and sulfur. In each case the treatment of the natural or synthetic production of the pyrite material is followed by a surface processing of the photoactive layer. The processing chiefly involves polishing and etching operations and the like.

PROCESSES OF THE INVENTION

The present invention is also directed to particular processes for production and indicates the procedures to be carried out. These are classified according to the various methods for the preparation of photosensitive pyrite:

A. From Naturally Occurring Pyrite

It has been shown that natural pyrite crystals themselves often show a small photoeffect, whose magnitude is highly dependent on the site where they are found. Relatively high photocurrents were obtained, for example, with pyrite crystals from Peru (found at Huanzala). An improvement in photosensitivity was achieved by thermal treatment of the material. Here the natural pyrite was annealed in an evacuated quartz ampoule for one week at 500° C. As a result, the photocurrent in some samples was increased by a factor of 100.

B. By Crystal Growth

Various processes exist for preparing single crystal and polycrystalline pyrite (bromide or $PbCl_2$ melt). One process is the preparation by means of gas transport reactions with halogens as the transporting agent. Iodine and chlorine have already been used as transporting agents. Polycrystalline and single crystal pyrite with high photosensitivity have been obtained in this way in laboratory experiments:

B.1. Preparation of Polycrystalline Pyrite as Starting Material:

For this purpose, high-purity sulfur (t5N5) was melted under high vacuum ($10^{-5}$ bar) in a quartz crucible for 30 minutes in order to degas it. After cooling, the sulfur remained under vacuum and was manipulated under a protective gas for removal of material. High-purity iron in the form of a foil (t4N, thickness=0.25 mm) or powder (m5N, 60 mesh) was heated in a dried $H_2/Ar$ stream (ratio 1:5) for 2 hours at 800 C. for reduction of the surface.

Stoichiometric quantities of iron and sulfur (10 g) were caused to react in evacuated ($10^{-5}$ bar), sealed quartz ampoules (diameter 20 mm, length 200 mm) at ca. 600° C. (in an earlier experiment, at ca. 650° C.). To guard against the thermal dissociation of pyrite into pyrrhotite (FeS) and sulfur, the synthesis was carried out with a small excess of sulfur (650° C., ampoule volume=50 ml, excess of sulfur=15 mg). In the presence of a small amount of a halogen (less than 1 mg/cm$^3$), iodine in the earlier experiment (0.5 mg/cm$^3$), the reaction was complete after 100 hours.

B.2. Preparation of Polycrystalline Pyrite Layers from Pyrrhotite (FeS) and Sulfur (S) Arsenic (As) Doped:

A quartz ampoule having external diameter 20 mm and a length of 300 mm was charged with 2 g $FeS_2$ (pyrite) in powder form and 5 mg As, and evacuated to $10^{-5}$ bar. After addition of bromine (0.5 mg/cm$^3$), the ampoule was sealed off. The substances, placed at one end of the ampoule (see also FIG. 1), were heated to 800° C. for 10 days in a resistance furnace. The free end of the ampoule remained at a temperature of 550° C. By the decomposition of the pyrite powder and by local transport with bromine, pyrrhotite crystals having an edge length of 10 mm and 2 mm thickness were formed (I→II). The magnetic crystals aligned themselves along the lines of the magnetic field of the resistance furnace (I=6 amp, E=220 V; diameter of heater winding 50 mm, slope of winding 2 mm, number of turns 30).

Figure 1:
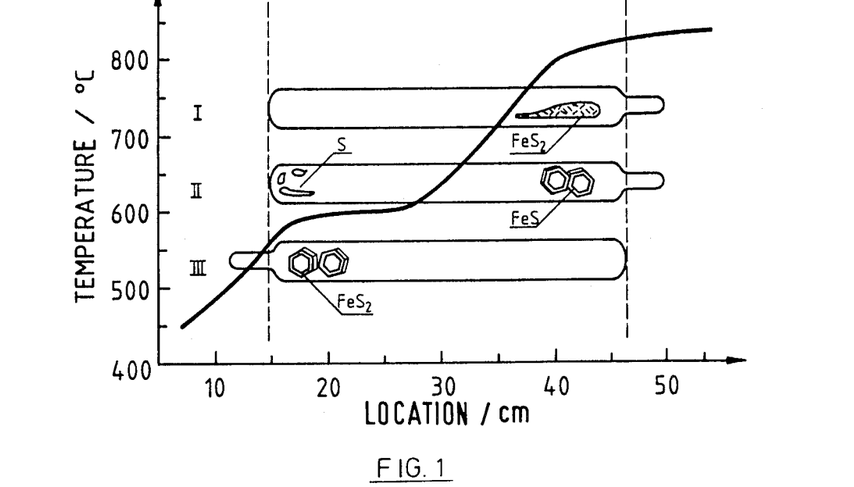
FIG. 1 is a schematic representation of a process for preparing polycrystalline, photoactive pyrite.
Figure 2:
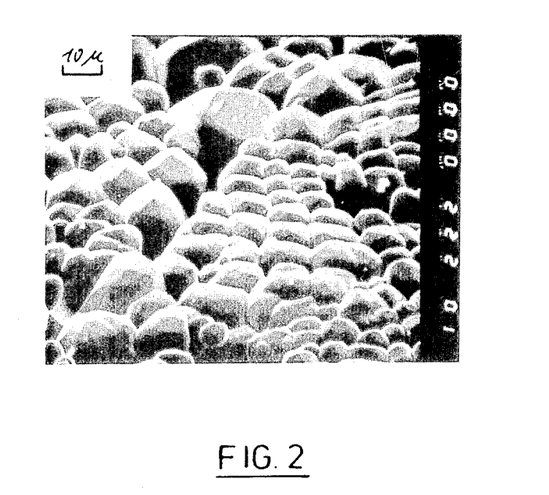
FIG. 2 shows a scanning electron microscope photograph of a polycrystalline, photoactive layer of $FeS_2$.

After reversal of the temperature gradient for 10 days longer, the pyrrhotite crystals were transformed, with retention of their external shape, back into statistically oriented pyrite crystals (5–20 μm) (III). Thus polycrystalline pyrite layers were produced, having 1 cm$^2$ area, which show photoactive properties. FIG. 1 shows the arrangement of the ampoules in the temperature gradient of the furnace. FIG. 2 shows scanning electron microscopic photographs of these polycrystalline layers.

B.3. Preparation of Single Crystals by Chemical Transport through the Gas Phase with $ICl_3$:

A quartz ampoule containing a 2 g $FeS_2$ pyrite in powder form was evacuated to $10^{-5}$ bar (external diameter of the quartz ampoule 22 mm, length 125 mm). After addition of $ICl_3$ (0.5 mg/cm$^3$), the ampoule was sealed off and the $FeS_2$ was transported in the tube furnace from 630° C. to 550° C. (in an earlier experiment, from 650° C. to 600° C.) After 10 days, polyhedric crystals of pyrite ((100) and (111) faces) formed, having edge lengths of ≦5 mm. The crystals are photoactive.

Figure 3:
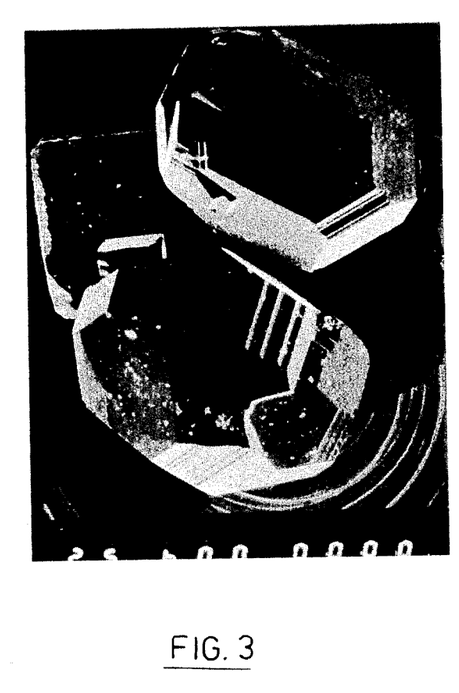
FIGS. 3 to 7 show several scanning electron microscope photographs of synthetic photoactive single crystals of $FeS_2$.
Figure 4:
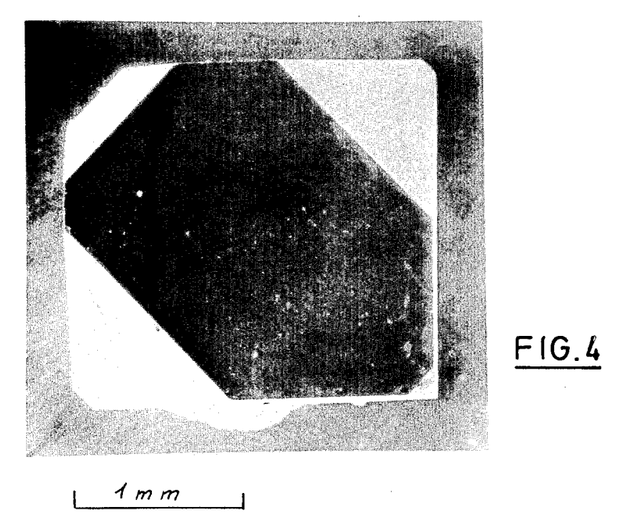
Figure 5:
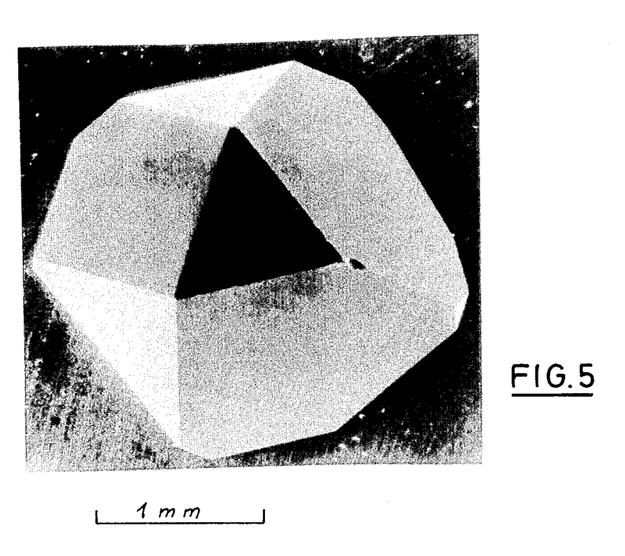
Figure 6:
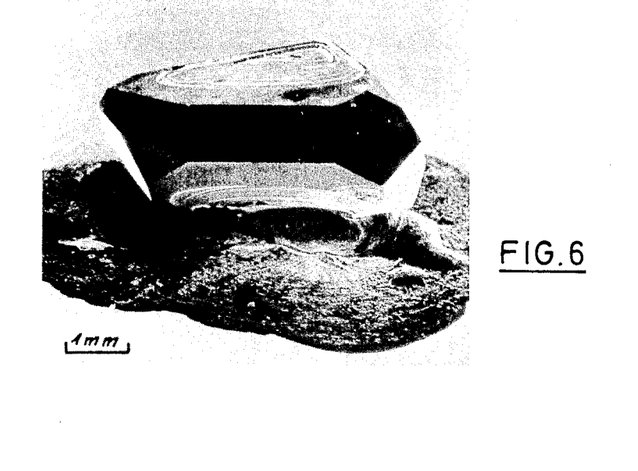
Figure 7:
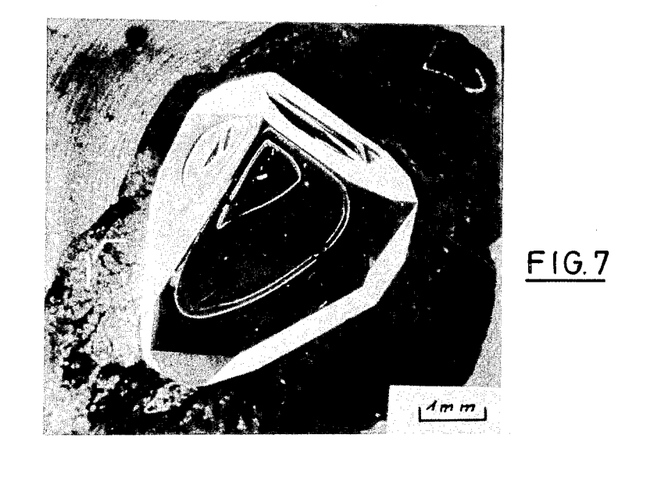

B.4. Preparation of Single Crystals by Chemical Transport through the Gas Phase with $Br_2$:

A quartz ampoule (external diameter 22 mm, length 340 mm) containing 2 g $FeS_2$ (pyrite) in powder form and 1 mg As was evacuated to $10^{-5}$ and 0.5 mg/cm$^3$ of bromine was added. After the ampoule was sealed off, the contents were transported in the tube furnace from 650° to 600° C. After 11 days, crystals ((100 and (111) faces) had formed, with edge lengths ≦1 mm. The photoactive properties of these crystals are better than in the examples showing the preparation of polycrystalline pyrite layers. (FIG. 3 shows a scanning electron microscope photograph of synthetic photoactive single crystals of $FeS_2$ prepared in this manner.)

B.5. Thin Layer Techniques:

The possibility also exists of preparing pyrite in thin layers for thin-layer solar cells. The prerequisite for this application is a high absorptivity of pyrite for light in the visible wavelength region. The investigations have shown that pyrite possesses a high absorption coefficient of more than $2 \times 10^4$ cm$^{-1}$ for visible light. Values of $6.5 \times 10^5$ cm$^{-1}$ have even been measured. An energy-converting pyrite layer must therefore be no thicker than 1μ or a few μ, and, as already mentioned above, can be as low as 0.016μ, and can be made by the usual technological thin layer methods. Among these methods, which have already proven themselves, are:

1. Epitaxy;
2. Sputtering techniques;
3. Electrochemical deposition;
4. Chemical vapor phase transport, especially CVD (chemical vapor deposition); and
5. Plasma deposition.

Interesting and especially preferred starting compounds for expitaxy, for CVD techniques, and plasma deposition are, for example, iron halides and sulfur-hydrogen compounds or organic iron compounds, e.g. carbonyls such as pentacarbonyliron (Fe(CO)$_5$) or nonacarbonyldiiron (Fe$_2$(CO)$_9$) and sulfur. Besides the preferred compounds named here, other iron-halogen and iron-organic compounds can be considered.

BRIEF DESCRIPTION OF THE DRAWINGS

Several figures have already been referred to in the above disclosure. The following description of the figures refers to preferred embodiments of the invention.

DESCRIPTION OF THE PREFERRED EMBODIMENTS

The single crystals of $FeS_2$ shown in FIGS. 4 to 7 were prepared in a manner similar to that described in B.4 above, but with the addition of 1 mg of Mn in place of As. The temperature for crystal growth was 580° C. These crystals exhibited edge lengths of up to 6 mm. A half-width of 4 angular seconds was measured from rocking curves for the crystals in FIGS. 4 and 5. This signifies a high degree of perfection of the crystallinity.

Photoelectrochemical Solar Cells

Figure 8:
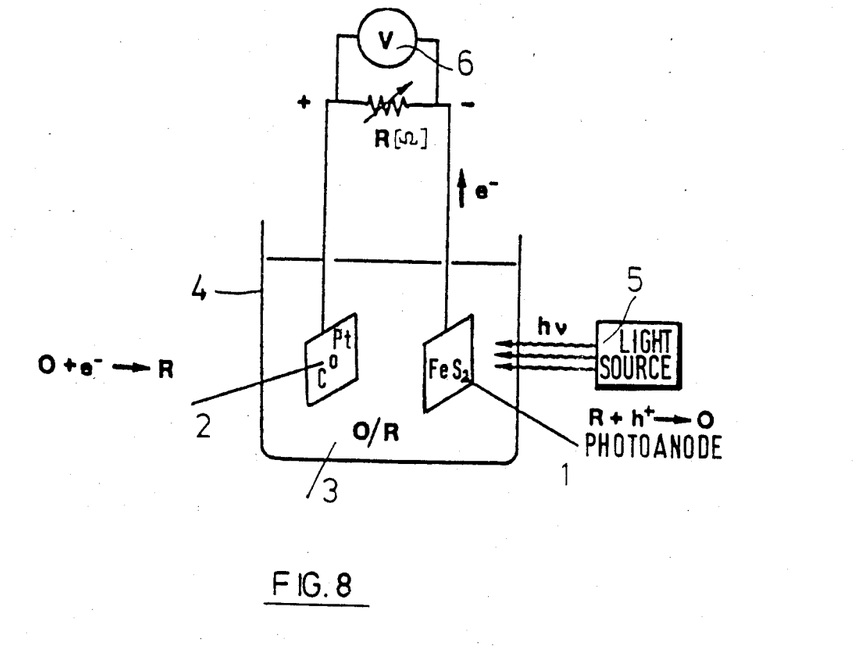
FIG. 8 is a schematic diagram of a photoelectrochemical solar cell using pyrite.

In the arrangement shown in FIG. 8, pyrite is used as a photosensitive electrode in an electrochemical solar cell. The photoactive electrode 1 consists of an electrically contacted pyrite layer. A metal screen or a carbon rod serves as the counter electrode 2. Both electrodes are in contact with an aqueous or organic electrolyte 3, which contains an O/R redox system, such as $I^-/I_2$, as an additive, and are inside a vessel 4. When light source 5 is switched on, the system converts the light into electrical energy, which can be measured at voltmeter 6. The oxidation and reduction processes which take place at the two electrodes are indicated schematically.

Figure 9:
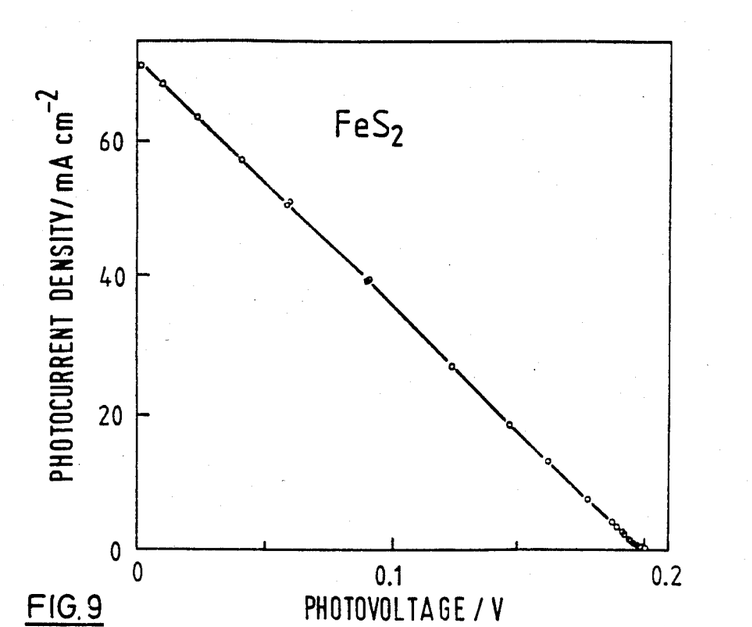
FIG. 9 is a graph of the performance character of a photoelectrochemical solar cell using monocrystalline $FeS_2$.

The performance curve for such a photoelectrochemical $FeS_2$ solar cell using single-crystal $FeS_2$ and aqueous electrolytes (pH 3.5) with $I^-/I_2$ (3M KI, $10^{-2}$M $I_2$) is represented in FIG. 9.

Figure 10:
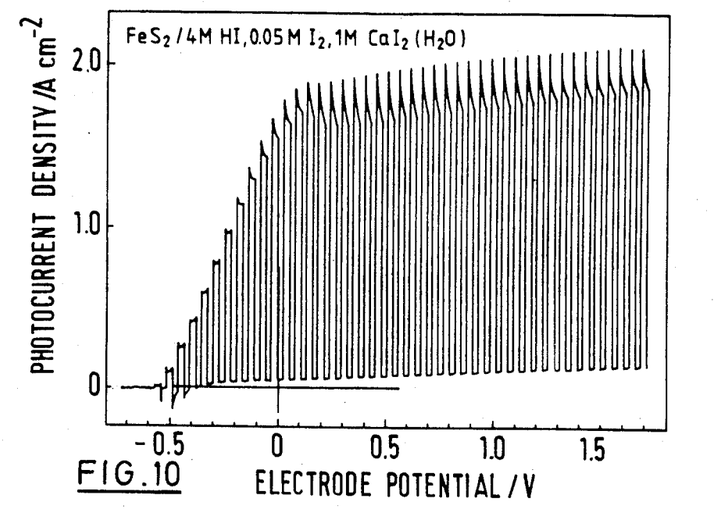
FIG. 10 is a graph of the performance character of a photoelectrochemical $FeS_2$ solar cell under periodic illumination.

In the photocurrent-voltage curve shown in FIG. 10, an aqueous electrolyte solution comprising 4M HI, 0.05M $I_2$ and 1M $CaI_2$ was used. The illumination was carried out with a power of 4.5 W. The periodic illumination clearly shows the effect of light on the differences between photo- and dark currents, as well as on the decay of the photocurrent resulting from a depletion of the reduced species $I^-$ at the surface of the $FeS_2$ electrode.

Figure 11:
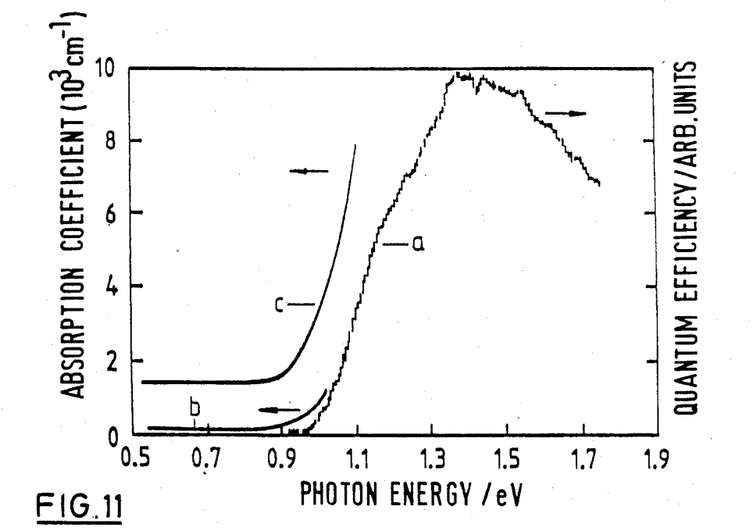
FIGS. 11 to 13 are graphs of the relative spectral sensitivity or the absorption spectra of $FeS_2$.

The spectral dependence of the light sensitivity is shown in FIG. 11, wherein curve a is the photocurrent spectrum of polycrystalline $FeS_2$ (aqueous electrolyte, 3M KI, 0.05M $I_2$); and b,c is the absorption coefficient.

Figure 12:
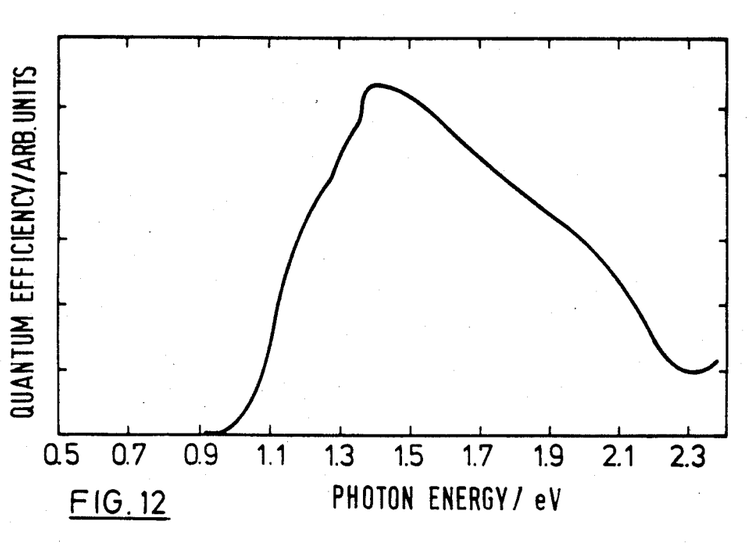

FIG. 12 shows the relative spectral sensitivity in a broader energy range under short-circuit conditions. The quantum yield in the high-energy portion of the sensitivity spectrum is dependent on the surface treatment of the pyrite.

Figure 13:
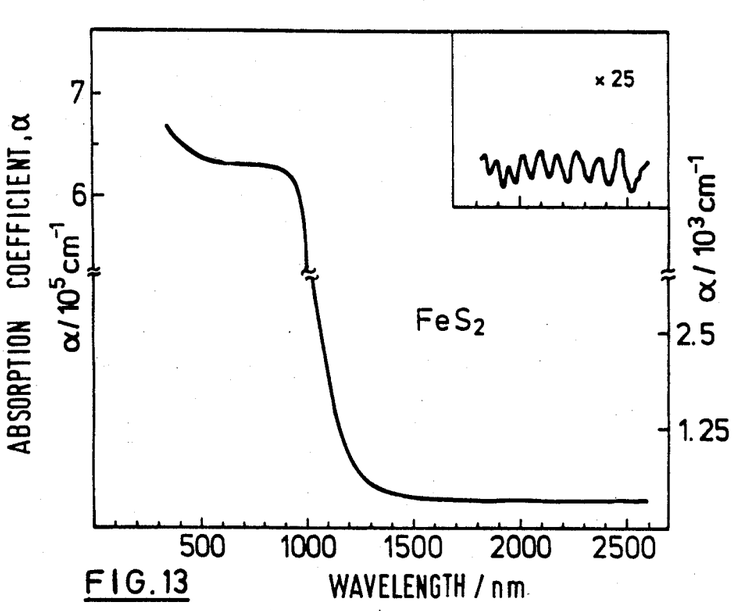

A complete absorption spectrum of pyrite, measured on a crystal plate 8 μm thick and 50 mm² in area is presented in FIG. 13.

Figure 14:
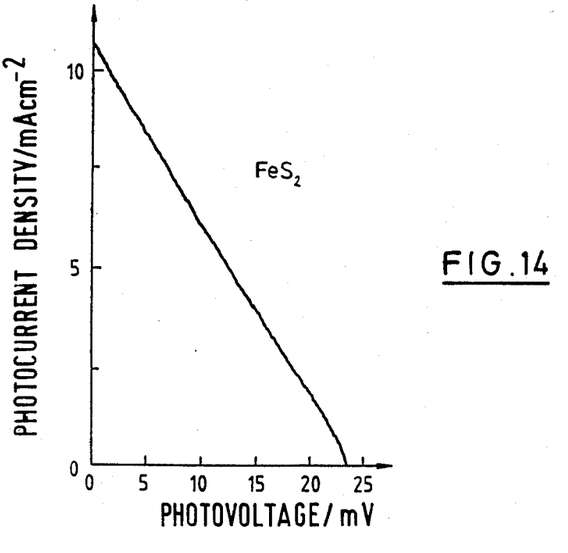
FIGS. 14 and 15 are graphs of the performance characteristic of electrochemical solar cells using polycrystalline $FeS_2$.
Figure 15:
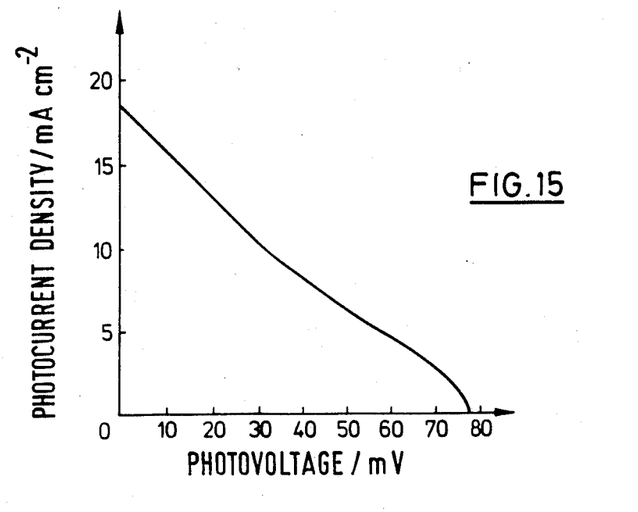

The performance characteristic of a first electrochemical solar cell using polycrystalline $FeS_2$ (aqueous electrolyte, 3M KI, 0.05M $I_2$) is shown in FIG. 14, while FIG. 15 shows a version which is considerably improved by surface treatment.

The electrode surfaces can be altered and the conversion yield increased by pretreatment of the surfaces, i.e. etching procedures, immersion procedures, and the like. The photoelectrochemical characteristics of pyrite can be improved, e.g. by immersion of the material into HF (e.g. 40%, for 40 sec). It has been found particularly effective, after a polishing of the surface, to treat the material in a concentrated solution of $HF/CH_3COOH/HNO_3$ in the volume ratio 1:1:2 for 60 sec, followed by a rinsing with deionized water and then immersion under anodic polarization in a concentrated solution of $H_2O_2/H_2SO_4$ in the volume ratio 1:1 for an additional 60 sec.

Among the possibilities for optimization which can lead to an increase in the energy conversion yield is variation of the electrolytes. An improvement can also be achieved by coating the surface of the $FeS_2$ with other compounds which likewise crystallize in the same structure. Here a utilization for for photoelectrolysis is likewise conceivable (e.g. $RuS_2$ deposited on $FeS_2$).

Solid State Solar Cells

Figure 16:
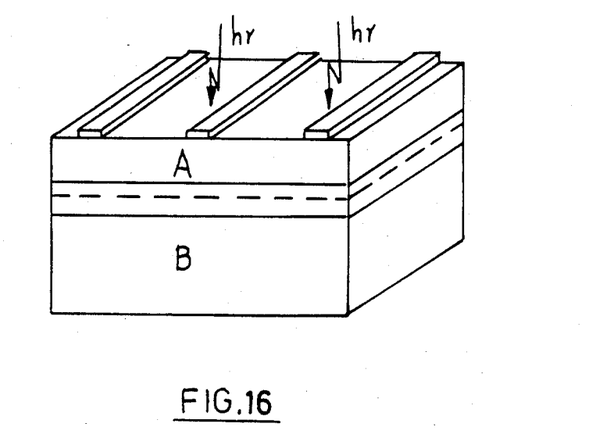
FIG. 16 is a perspective representation of the construction possibilities of solid-state solar cells based on pyrite.

Various possibilities exist for utilizing pyrite as a semiconductor material in solid-state solar cells. FIG. 16 is a schematic representation of the construction of solid-state solar cells based on pyrite. Thus, in the case of n-p homojunction, for example, A=n-$FeS_2$ and B=p-$FeS_2$. In the case of a Schottky solar cell, A=M and B=$FeS_2$. For a heterojunction, A=$MX_2$ and B=$FeS_2$. The light is assumed to fall on the structure at arrows hv.

The conversion of light energy has already been shown on a laboratory scale with an $FeS_2$/Ni and an $FeS_2$/Au Schottky barrier.

Figure 17:
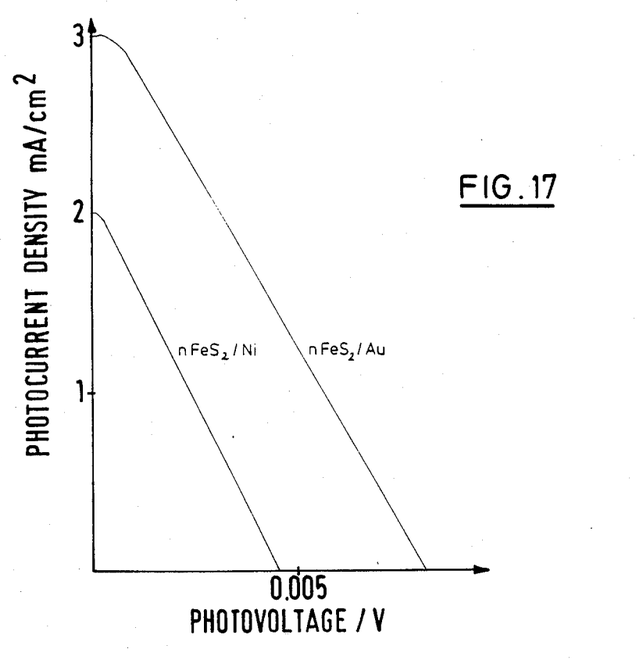
FIG. 17 is a graph of the performance characteristic of a photovoltaic solar cell (Schottky barrier).

Here $FeS_2$ crystals made by the preparation of polycrystalline pyrite layers from pyrrhotite were coated with Ni or Au (500 Å) without pretreatment and measured. The system acted as a photovoltaic solar cell. The performance characteristic is represented in FIG. 17. The conversion yield here is quite modest, which is attributable in part to the large proportion of impurities at the $FeS_2$ surface (with XPS the following could be detected; FeO, $Fe_2O_3$, $SO_x$ species, C compounds). Considerable improvement in the yields, which were expected by treatment of the surfaces as well as by identification of more suitable contact materials (e.g. metallically conducting $MX_2$ compounds having the pyrite structure), have already been effected to some extent.

P-N Junctions

Pyrite has the advantage, as a solar cell material, that it can be produced as both an n- and a p-conductive material. The n-conductivity can be achieved e.g. by doping with Co or Ni, and the p-conductivity by doping with As. Therefore p-n junctions can be made in a simple manner by diffusion of suitable dopants into n- or p-conductive $FeS_2$.

As an example of this embodiment, a crystal of $FeS_2$ with n-conductivity was coated with a 500 Å thick Cu layer. Cu was then diffused in for 24 hours at 200° C. An n-p homojunction was formed. After contacting the n and p regions (Cu doped), a photovoltage of 40 mV was measured on illumination. This photovoltage can be further improved by defined doping.

Heterojunctions

The great number of available compounds having the pyrite structure ($MX_2$, $MXX'$, $MXY$, $M_xM_yX_2$, $MY_2$, $MYY'$) permits the development of different heterojunctions. Chemical immersion methods (metal ion exchange), electrochemical deposition, growth from the gas phase and the like can be used as simple preparative methods.

Multijunctions

Multijunctions can also be prepared by similar methods. Here too the large number of known compounds having the pyrite structure ($MX_2$, $MXX'$, $MXY$, $M_xM_yX_2$, $MY_2$, $MYY'$) simplifies the selection of adaptable materials. The theoretical requirements in terms of the positions of the energy bands and the energy gaps are fundamentally known. In this way it is possible to achieve higher yields than with an individual photoactive $FeS_2$ junction.

Application of $FeS_2$ in Optoelectronic Components

Figure 18:
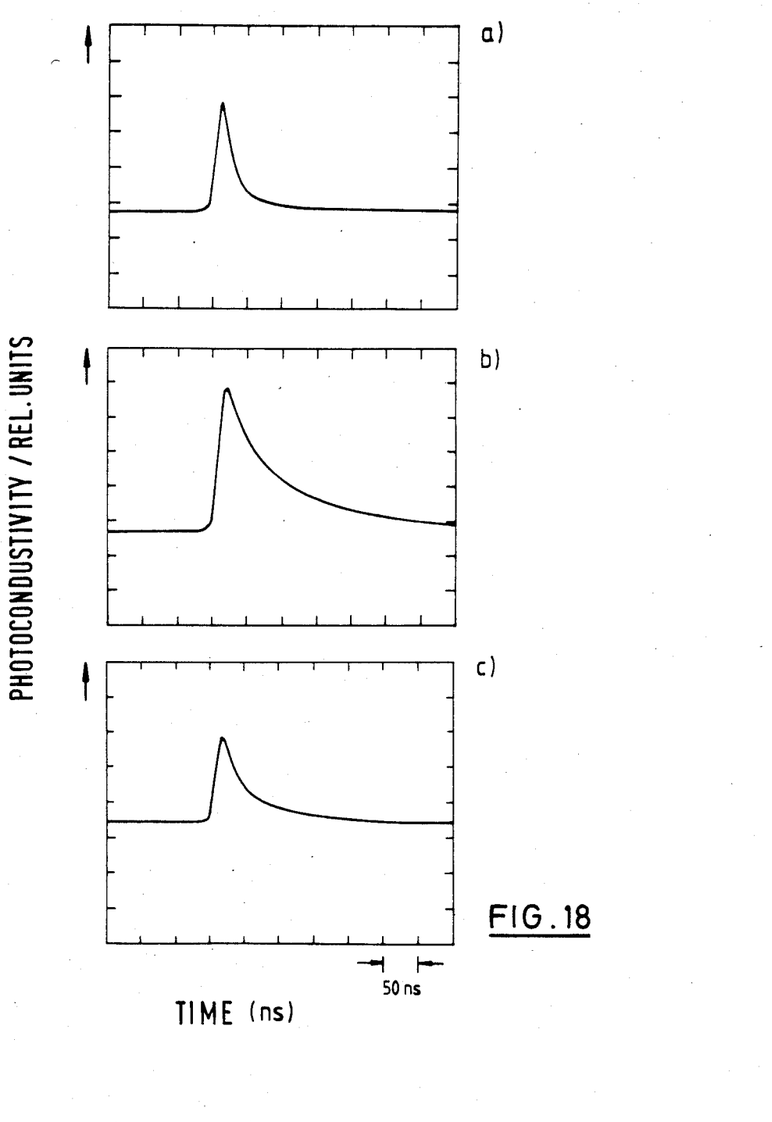
FIG. 18 shows three graphs on the same scale of the time-dependent photoconductivity after a 15 ns laser pulse (microwave measurement) using:
a. natural pyrite, annealed at 300° C.;
b. synthetic pyrite; and
c. natural pyrite, annealed at 400° C.

The high sensitivity to light which has been determined in suitably treated pyrite permits it to be used in detectors and optoelectronic systems for information transfer. The lifetime of the light-induced charge carriers, which is the determining factor for the time behavior of pyrite as a detector, depends on the nature of the preparation or treatment of the material. Three examples of signals measured as light-inducted microwave absorption as responses to a 15 ns laser pulse are represented in FIG. 18, namely: (a) natural pyrite, annealed at 300° C.; (b) synthetic pyrite; and (c) natural pyrite, annealed at 400° C. The sides of the signal in (a) are so steep, i.e. the half-width of the electrical signal, about 25 ns, is so narrow, that bit rates of about 40 Mbit/s can be directly processed with it.

Reports on the work of the inventors which forms the basis for the present invention will or have appeared in publications in the scientific and technical literature, in particular in the July 1985 issue of the *Journal of the Electrochemical Society*, by Ennaoui et al., "Photoactive Synthetic Polycrystalline Pyrite ($FeS_2$)" (Vol. 132, pp 1579–1582) and by Ennaoui et al., expected to appear in an issue of the same journal in the near future, "Photoelectrochemistry of Highly Quantum Efficient Single Crystalline n-$FeS_2$ (Pyrite)" (Vol. 133, pp 97–106, January 1986).

While specific embodiments of the invention have been shown and described in detail to illustrate the application of the principles of the invention, it will be understood that the invention may be embodied otherwise without departing from such principles.

What is claimed is:

1. A photoactive structure comprising a body of pyrite material having the formula $FeS_{2\pm x}$, where x is $\leq 0.05$, a doping of from $10^{16}$ to $10^{19}$ per $cm^3$ selected from the group consisting of manganese, arsenic, cobalt, and chloride, with a concentration of other impurities of less than $10^{20}$ per $cm^3$.

2. A photoactive structure according to claim 1, wherein the body of pyrite is doped so as to have an effective charge carrier density of more than $10^{15}$ per $cm^3$, a derived charge carrier mobility of about 200 $cm^2/Vs$, a conversion yield of at least 1%, a quantum yield of up to about 90% and a photovoltage of more than 0.25 V.

3. A process of making a photoactive structure comprising a layer of pyrite material having the formula $FeS_{2\pm x}$, where x is $\leq 0.05$, a doping of from $10^{16}$ to $10^{19}$ per $cm^3$ selected from the group consisting of manganese, arsenic, cobalt, and chloride, with a concentration of other impurities of less than $10^{20}$ per $cm^3$, the process comprising subjecting naturally occurring pyrite to a thermochemical treatment for improving the desired crystallinity, purity, and stoichiometry of the pyrite material, and subjecting the layer of heat treated pyrite material to a selected etching, immersion, or anodic polarization surface treatment for improving the photosensitivity of the layer.

4. A process according to claim 3, wherein the pyrite material is originally in the form of a block, and including cutting of thin layers from the block to form a photoactive layer.

5. A process according to claim 3, wherein the naturally occurring pyrite material is originally in the form of powder and the layer of pyrite material is produced by chemical transport.

6. A process according to claim 3, wherein the thermal treatment is carried out in an evacuated vessel at about 500° C. over a period of about one week.

7. A process according to claim 3, including polishing the pyrite layer and etching the polished pyrite layer using wet chemical means in a first step for about 30 to 60 seconds with a concentrated solution of $HF/CH_3COOH/HNO_3$ in the proportions of 1:1:2, and then with $H_2O_2$ (30%)/$H_2SO_4$ (95%) in the proportion of 1:1 under anodic polarization.

8. A process according to claim 7, including using the pyrite layer as an electrode in a photoelectrochemical solar cell with an aqueous solution of 4M HI, 0.05M $I_2$ and 1M $CaI_2$ as an electrolyte.

9. A process of making a photoactive structure comprising producing a pyrite material synthetically by reaction between either iron or iron containing compounds, and either sulfur or sulfur containing compounds, forming the produced pyrite material into either thin layers or crystalline bodies by crystal growth from which slices of pyrite material can be cut and further surface treating the slices of material by etching, immersion, or anodic polarization to improve the photosensitivity thereof.

10. A process according to claim 9, including melting high purity sulfur under high vacuum for about 30 minutes, cooling the melted sulfur while maintaining a vacuum, manipulating the cooled sulfur under a protective gas for the purpose of removing material, heating high purity iron in the form of either a powder or foil to about 800° C. under a stream of dry $H_2/Ar$ gas mixture for about two hours to reduce the surface of the high purity iron, mixing stoichiometric quantities of the iron and sulfur together in an evacuated, sealed vessel at about 650° C. to react the iron and sulfur, continuing the reaction for about 100 hours with the addition of small amounts of halogen and in the presence of small amounts of excess sulfur to avoid thermal dissociation of pyrite into pyrrhotite and sulfur.

11. A process according to claim 9, wherein powdered pyrite and arsenic are placed at one location in a vessel, subjecting the vessel to high vacuum, adding bromine to the vessel and sealing the vessel, heating the vessel to 800° C. at the location where the powdered pyrite and arsenic are placed, a temperature of 550° C. being maintained at another location in the vessel so that over a period of about ten days pyrrhotite crystals are formed in a thin layer of decomposition of the pyrite powder and by local transport with the bromine, and reversing the temperature gradient in the vessel to reform the thin layer of pyrrhotite crystals during about ten more days into statistically oriented pyrite crystals.

12. A process according to claim 9, wherein the crystal growth of pyrite is carried out by way of gas transport reactions with either a halogen or interhalogen compound as the transport agent.

13. A process according to claim 9, wherein the pyrite is deposited as a thin layer from the gas phase by thermal decomposition and reaction of either iron carbonyls or iron halides, with either sulfur or hydrogen sulfide gas.

14. A method of using as a solar cell electrode in a circuit, a photoactive structure comprising a body of pyrite material having the formula $FeS_{2\pm x}$, wherein x is $\leq 0.05$, a doping of from $10^{16}$ to $10^{19}$ per $cm^3$ selected from the group consisting of manganese, arsenic, cobalt, and chloride, and a concentration of other impurities of less than $10^{20}$ per $cm^3$, the method comprising subjecting the body of pyrite material in the form of a solar cell electrode in a circuit to illumination by light to convert the light to electrical energy in the circuit.

15. A method of using as an opto-electronic component in a circuit, a photoactive structure comprising a body of pyrite material having the formula $FeS_{2\pm x}$, where x is $\leq 0.05$, a doping of from $10^{16}$ to $10^{19}$ per $cm^3$ selected from the group consisting of manganese, arsenic, cobalt, and chloride, and a concentration of other impurities of less than $10^{20}$ per $cm^3$, the method comprising subjecting the body of pyrite material in the form of an opto-electronic component in a circuit to light pulses to obtain electrical signal responses.

16. A method of claim 15, wherein said body is subjected to laser light pulses and the responses are measured as light-induced microwave absorption.

* * * * *